(12) United States Patent
Aleshin et al.

(10) Patent No.: US 6,854,104 B2
(45) Date of Patent: Feb. 8, 2005

(54) FIRST APPROXIMATION FOR OPC SIGNIFICANT SPEED-UP

(75) Inventors: Stanislav Aleshin, Moscow (RU);
Marina Medvedeva, Moscow (RU);
Jaroslav Kalinin, Moscow (RU);
Sergel Rodin, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 9 days.

(21) Appl. No.: 10/306,067

(22) Filed: Nov. 27, 2002

(65) Prior Publication Data

US 2004/0103388 A1 May 27, 2004

(51) Int. Cl.⁷ .............................. G06F 17/50; G03C 9/00
(52) U.S. Cl. ................................ 716/19; 716/21; 430/5
(58) Field of Search .............................. 716/1, 2, 5, 11, 716/4, 19, 21; 703/5, 13; 430/5, 30; 355/67

(56) References Cited

U.S. PATENT DOCUMENTS

| | | | | |
|---|---|---|---|---|
| 5,441,834 A | * | 8/1995 | Takekuma et al. ............. | 430/5 |
| 6,171,731 B1 | | 1/2001 | Medvedeva et al. | |
| 6,243,855 B1 | * | 6/2001 | Kobayashi et al. ............ | 716/19 |
| 6,301,697 B1 | * | 10/2001 | Cobb ........................... | 716/19 |
| 6,453,457 B1 | * | 9/2002 | Pierrat et al. .................. | 716/19 |
| 6,467,076 B1 | * | 10/2002 | Cobb ........................... | 716/19 |
| 6,516,459 B1 | * | 2/2003 | Sahouria ...................... | 716/21 |
| 6,539,521 B1 | * | 3/2003 | Pierrat et al. .................. | 716/4 |
| 6,584,609 B1 | * | 6/2003 | Pierrat et al. .................. | 716/19 |
| 6,625,801 B1 | * | 9/2003 | Pierrat et al. .................. | 716/19 |
| 6,643,616 B1 | * | 11/2003 | Granik et al. ................. | 703/13 |
| 6,653,026 B2 | * | 11/2003 | Pierrat et al. .................. | 430/5 |
| 2003/0110465 A1 | * | 6/2003 | Zhang .......................... | 716/19 |
| 2004/0019869 A1 | * | 1/2004 | Zhang .......................... | 716/11 |
| 2004/0060034 A1 | * | 3/2004 | Cote et al. .................... | 716/21 |

OTHER PUBLICATIONS

Cobb et al., "Flows for model–based layout correction of mask proximity effects", Proc. SPIE Int. Soc. Opt. Eng, vol. 5256, (95 (20003).*

Cobb et al., "New concepts in OPC", Proc. SPIE Int. Soc. Opt. Eng., vol. 5377, 680 (2004).*

Beale et al., "Multiple stage optical proximity correction", Proc. SPIE Int. Soc. Opt. Eng., vol. 5040 (2003).*

Harazaki et al., "High accurate optical proximity correction under the influences of lens aberration in 0.15 μm logic process", Jul. 11–13, 2000, Microprocesses and Nanotechnology Conference, 2000 International , pp.: 14–15.□□□□.*

Schellenberg et al., "Adoption of OPC and the impact on design and layout", Jun. 18–22, 2001, Design Automation Conference, 2001. Proceedings , pp.: 89–92.□□□□.*

* cited by examiner

*Primary Examiner*—Vuthe Siek
*Assistant Examiner*—Helen Rossoshek
(74) *Attorney, Agent, or Firm*—Sawyer Law Group LLP

(57) ABSTRACT

An optical proximity correction system for local correction of an aerial image produced from a mask having transmissive portions and blocking portions collectively defining a target design includes an analyzer to match one or more segments of the target design to one or more typical case segments from a predetermined set of typical case segments; a controller, coupled to the analyzer, for approximating each of the one or more segments of the target design with matching typical case segments from the set of typical case segments to produce an adjusted aerial image. The method for optical proximity correction using local correction of an aerial image produced from a mask having transmissive portions and blocking portions collectively defining a target design, includes: a) analyzing the target design to produce one or more segments from the target design and to match the one or more segments to one or more typical case segments from a predetermined set of typical case segments; and b) approximating each of the one or more segments of the target design with the matching typical case segments from the set of typical case segments to produce an adjusted aerial image.

10 Claims, 3 Drawing Sheets

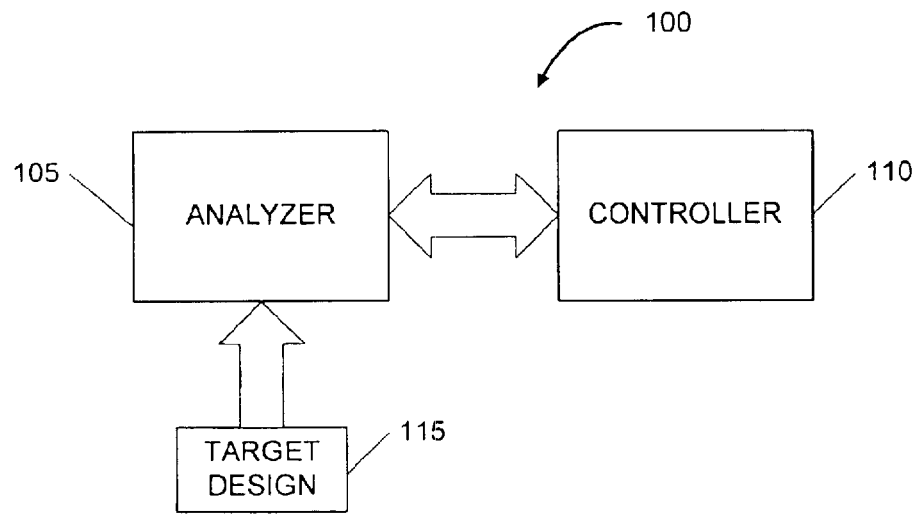
Figure_1
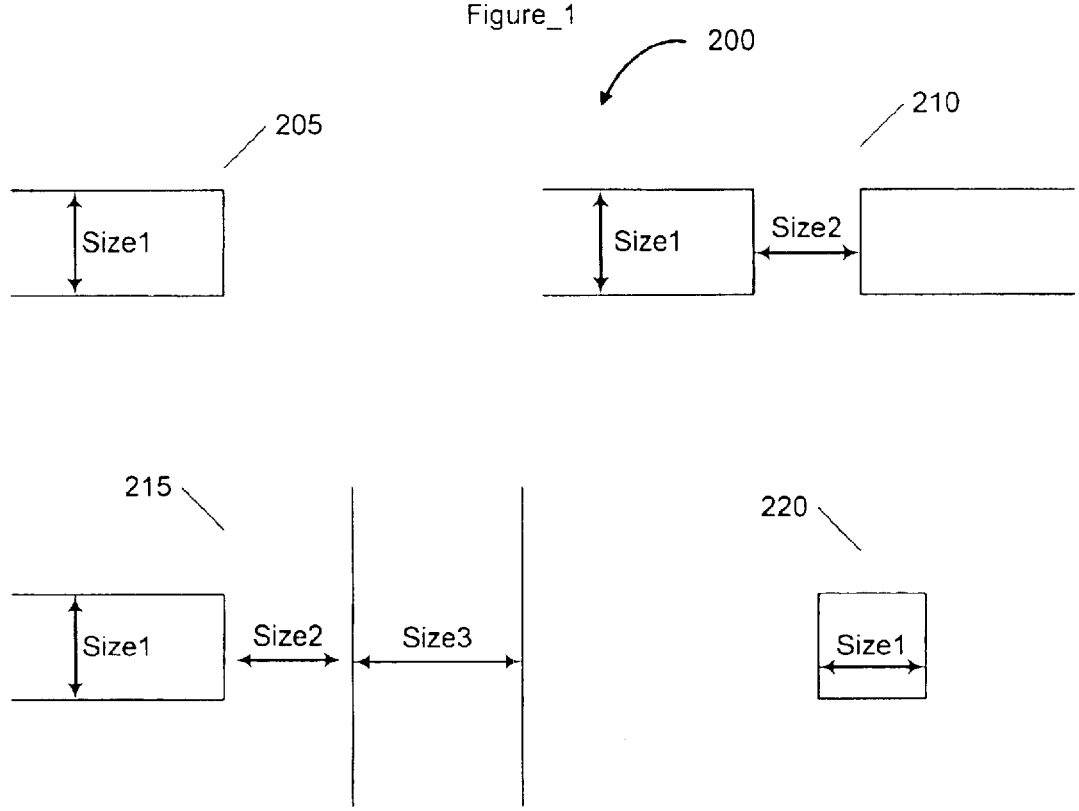
Figure_2

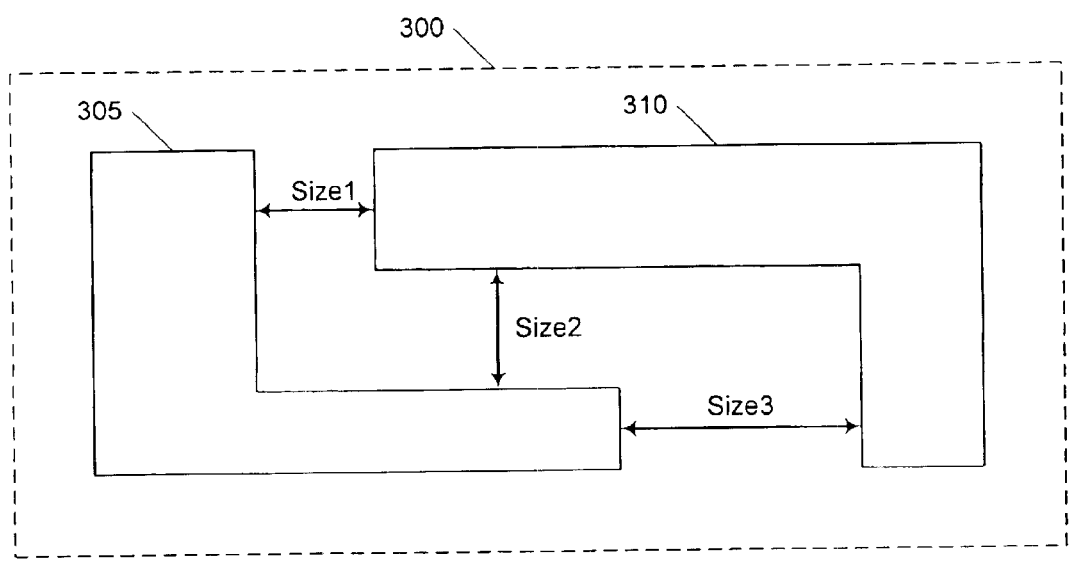
Figure_3
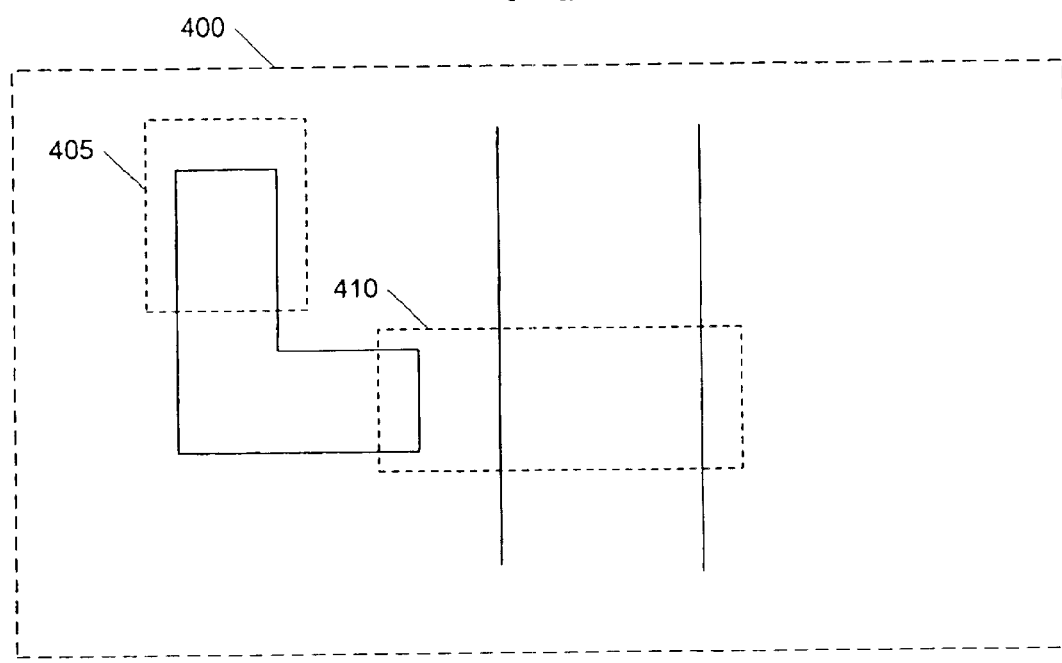
Figure_4

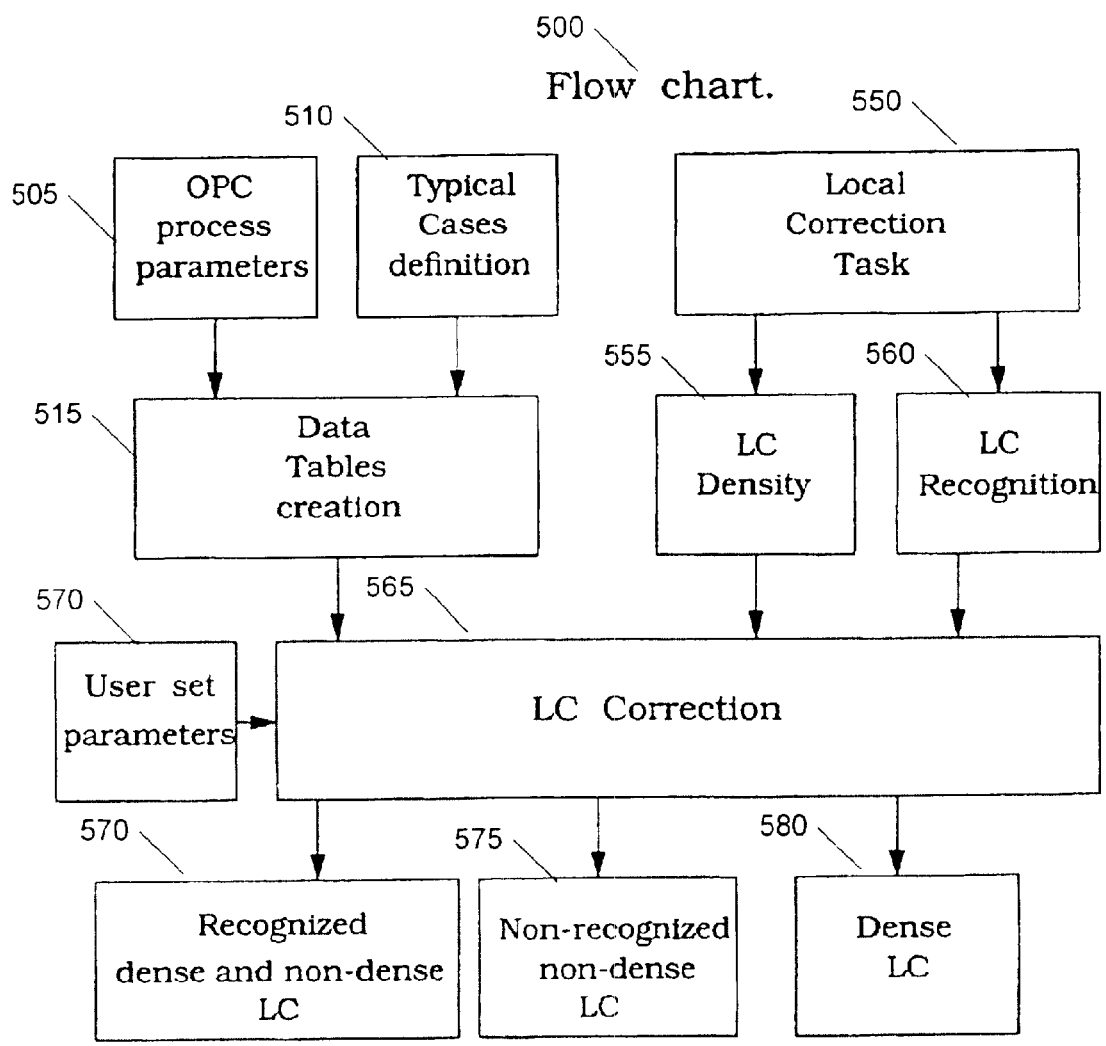
Figure_5

FIRST APPROXIMATION FOR OPC SIGNIFICANT SPEED-UP

FIELD OF THE INVENTION

The invention relates generally to optical proximity correction (OPC) systems of aerial images produced from a mask used, for example, in the manufacture of semiconductor devices, and relates more specifically to improving the performance of OPC systems.

BACKGROUND OF THE INVENTION

OPC systems are well known in the art. For example, U.S. Pat. No. 6,171,731 (the '731 patent) issued to Medvedeva, et. al. entitled "Hybrid Aerial Image Simulation" provides a background for OPC and a useful OPC process. The specification of the '731 patent is hereby incorporated herein as though set forth in full by this reference. The '731 patent describes a trade-off that users of an OPC system must make. Namely, that OPC is a computationally intensive task, dependent upon the desired resolution or accuracy of the correction to be made, therefore a user must decide how much time to spend to achieve a desired resolution, when both time and resolution are important. Typically there are common algorithms used in the OPC process that are executed with much iteration. As a corrected aerial image is processed to more closely produce the desired pattern on the underlying media, the longer it takes to perform the calculation. If any change to the mask is needed, due to any number of factors, OPC must be performed again. Mask changes are frequent in research and development, for example, meaning that the prior art OPC process has a significant impact on the development and implementation of new mask designs and attendant products.

Accordingly, what is needed is a system and method for simply and efficiently performing OPC system processes to reduce the impact that OPC processes have on determination of a desired mask or aerial image. The present invention addresses such a need.

SUMMARY OF THE INVENTION

An optical proximity correction system for local correction of an aerial image produced from a mask having transmissive portions and blocking portions collectively defining a target design includes an analyzer to match one or more segments of the target design to one or more typical case segments from a predetermined set of typical case segments; and a controller, coupled to the analyzer, for approximating each of the one or more segments of the target design with matching typical case segments from the set of typical case segments to produce an adjusted aerial image. The method for optical proximity correction using local correction of an aerial image produced from a mask having transmissive portions and blocking portions collectively defining a target design includes: a) analyzing the target design to produce one or more segments from the target design and to match the one or more segments to one or more typical case segments from a predetermined set of typical case segments; and b) approximating each of the one or more segments of the target design with the matching typical case segments from the set of typical case segments to produce an adjusted aerial image.

The present invention simply and efficiently performs OPC processes that reduce the impact on aerial image/mask definition, and that permit improved performance. The OPC performance is improved by providing a similar level of accuracy in a shorter period, or by providing a greater degree of accuracy in a similar period as is currently performed.

BRIEF DESCRIPTION OF THE DRAWINGS

FIG. 1 is a block schematic diagram of a preferred embodiment of the present invention for an optical proximity correction (OPC) system;

FIG. 2 is a schematic representation of a set of typical case segments;

FIG. 3 is a diagrammatic representation of relevant dimensions for determining a local correction density;

FIG. 4 is representative diagram illustrating a segmentation of a target design into typical case segments; and FIG. 5 is a process flow diagram of the preferred embodiment of the present invention.

DETAILED DESCRIPTION

The present invention relates generally to optical proximity correction (OPC) systems of aerial images produced from a mask used, for example, in the manufacture of semiconductor devices, and relates more specifically to improving the performance of the OPC systems. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein. FIG. 1 is a block schematic diagram of a preferred embodiment of the present invention for an optical proximity correction (OPC) system 100. System 100 includes an analyzer 105 and a controller 110. Analyzer 105 receives a representation of a local correction target design 115 and, as will be explained in greater detail below, segments target design 115 into a set of design primitives. The receipt of the image may be by optical or other input system that transfers a representation of target design 1115, or relevant parts thereof, into analyzer 105.

Analyzer 105 communicates the set of design primitives from target design 115 to controller 110 for processing. Controller 110, of the preferred embodiment, includes a computing system having one or more microprocessors or microcontrollers, an input/output (I/O) system and memory (typically non-volatile memory) for storing a database and program instructions for implementing the present invention.

Controller 110 of the preferred embodiment stores a set of typical case segments in its memory. This set of case segments are representative of likely segments that could be expected to be found in an actual target design, along with corresponding detailed OPC parameters. The calculation intensive OPC of the typical cases are done in advance of actual application, therefore there is no particular need for a tradeoff between calculation accuracy and speed. Various implementations of the preferred embodiment will have more or fewer predetermined typical cases depending upon needs of the implementation. Additionally, the particular OPC process used to correct the typical cases is not believed to be important as the invention is considered to be useful independently of the particular OPC process.

Controller 110 compares each segment from the set of design primitives with the set of typical case segments stored in its memory. Each segment will either match, within some predetermined threshold, or will be unmatched. If one or more segments are unmatched, controller 110 performs an OPC on the unmatched segment(s) using the closest typical case(s) as an initial approximation(s). When all the segments from analyzer 105 are matched, controller 110 makes an additional density check. When matched segments are classified as "dense," there may be additional OPC processes that are needed. Density is a characterization set by the user prior to use and is dependent upon the design rules, process and OPC process. When controller 110 determines that the set of design primitives satisfy the density check, controller 110 uses the any matching typical case parameters as a first approximation and performs additional OPC processing as necessary. In some cases, the typical case segments may be defined in both a dense and a non-dense configuration. Matching typical cases for dense precalculation do not need to be recalculated.

Controller 110 of the preferred embodiment characterizes a target design (or primitives thereof) into three operational modes: 1) recognized non-dense local correction, 2) non-recognized non-dense local correction, and 3) unrecognized dense local correction. In mode 1, controller 110 has matched all the segments and uses the precalculated values as the OPC local correction. In mode 1, the speed of the local correction of the target design is greatly increased as the system looks up approximation values rather than calculate them. In mode 2, controller 110 only performs OPC on the unrecognized (unmatching) input segments, once again speeding up the calculation of the local correction for the target design since some local corrections do not need to be calculated (e.g., those that have been matched). In mode 3, controller 110 uses any matching typical cases as a first approximation to the density local correction processing of the OPC that will improve the overall time needed to perform the local correction for target design 115. In all three modes, speed improvements are realized.

FIG. 2 is a schematic representation of a set of typical case segments 200. These typical case segments include the following four primitives: 1) an end of line (EOL) 205 that includes a width parameter (Size1), 2) juxtaposed end of lines 210 that include the width (Size1) and a separation distance (Size2), 3) T-junction 215 having an EOL 205 disposed generally perpendicular to another line defined with three parameters (Size1 of EOL 205, Size2 is a separation distance between the elements, and Size3 is a width of the other line), and 4) Contact 220 having a width Size 1. These four primitives are used in the preferred embodiment though other embodiments may have other primitives relevant to the particular application or OPC process.

Creation of the predetermined set of typical cases results from varying Size1, Size2 and Size3 (as applicable) of the four primitives using one or more desired OPC processes (such as, for example, the one disclosed in the '731 patent). The Sizes are varied consistent with expected actual anticipated uses and consistent with design parameters for target design 115 for efficient operation. The OPC data relevant to these typical cases are calculated and stored for use by controller 110.

FIG. 3 is a diagrammatic representation of relevant dimensions of a portion 300 of a target design 115 for determining a local correction density of segments 305 and 310. Three Sizes are determined from juxtaposed segment 305 and segment 310: Size1, Size2 and Size3 as shown. A parameter, local correction density (LC Density), is set to be the minimum of Size1, Size2 and Size3. If LC Density is less than or equal to a "High_Density" program parameter set by the user, then the local correction is determined to be dense, else it is non-dense.

FIG. 4 is representative diagram illustrating a segmentation of a section 400 of target design 115 into typical case segments 405 and 410. In section 400, two relevant local corrections are identified as primitives to be evaluated. Segment 405 is an EOL and segment 410 is a T-Junction. Segments 405 and 410 are determined by analyzer 105 and passed to controller 110 shown in FIG. 1.

FIG. 5 is a process flow diagram of the preferred embodiment of the present invention. Process 500 includes some predetermination steps: an OPC process parameter determination step 505 and a typical cases definition step 510. Step 505 and 510 are used by a data table creation step 515. Step 510 and Step 515 were described above in connection with FIG. 2.

Thereafter, target design 115 is set up for a local correction task step 550 implemented by system 100. Process 500 determines a local correction density at step 555 and performs local correction recognition at step 560. Step 555 was described above in connection with the discussion of FIG. 3 and Step 560 was described above in connection with FIG. 4.

Process 500 then performs local correction step 565 using the predetermined table of Step 515, the density determination of Step 555 and the local correction recognition of Step 560, along with a data store 570 of user set parameters (e.g., the density threshold "High_Density" parameter) that are used in Step 565. The resulting state of process 500 corresponds to the modes described above in connection with FIG. 1: A recognized non-dense and dense local correction Step 575 corresponds to mode 1, a non-recognized, non-dense local correction Step 580 corresponds to mode 2, and a dense local correction Step 585 corresponds to mode 3.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An optical proximity correction system for local correction of an aerial image produced from a mask having transmissive portions and blocking portions collectively defining a target design, comprising:
    an analyzer to match one or more segments of the target design to one or more typical case segments from a predetermined set of typical case segments;
    a controller, coupled to the analyzer, for accessing a predetermined set of typical case segments from a set of potential target designs and a set of corresponding local corrections that were calculated in advance of application of the typical case segments in actual target designs, the controller further for approximating each of the one or more segments of the target design with matching typical case segments from the set of typical case segments to produce an adjusted aerial image.

2. The optical proximity correction system of claim 1 wherein the set of typical case segments includes end-of-line, abutting end-of-lines, "T-junction" and contact typical cases of varying dimensions.

3. The system of claim 1 wherein the controller initiates a local correction for unmatched segments of the target design.

4. The system of claim 1 wherein the controller initiates a local correction for matched dense segments of the target design using matching typical case segments as a first approximation.

5. A method for optical proximity correction using local correction of an aerial image produced from a mask having transmissive portions and blocking portions collectively defining a target design, comprising the steps of:
   a) providing a predetermined set of typical case segments from a set of potential target designs;
   b) in advance of application of the typical case segments in actual target designs, calculating a set of local corrections corresponding to each of the typical case segments;
   c) performing optical proximity correction by analyzing the target design to produce one or more segments from the target design and to match the one or more segments to one or more typical case segments from the predetermined set of typical case segments; and
   d) approximating each of the one or more segments of the target design with the matching typical case segments from the set of typical case segments to produce an adjusted aerial image.

6. The method of claim 5 wherein the set of typical case segments includes end-of-line, abutting end-of-lines, "T-junction" and contact typical cases of varying dimensions.

7. The method of claim 5 further comprising the step of:
   c) initiating a local correction for unmatched segments of the target design.

8. The method of claim 5 further comprising the steps of:
   a) initiating a local correction for matched dense segments of the target design using matching typical case segments as a first approximation.

9. A set of local corrections for a predetermined set of typical case segments, comprising:
   a plurality of design primitives representative of typical cases of a set of potential target designs; and
   a corresponding set of local corrections corresponding to each of the plurality of design primitives calculated in advance of application of the plurality of design primitives in an actual target design.

10. A method for developing a set of local corrections for a predetermined set of typical case segments, comprising the steps of
    developing a plurality of design primitives representative of typical cases of a set of potential target designs; and
    calculating, in advance of application of the plurality of design primitives in an actual target design, a corresponding set of local corrections corresponding to each of the plurality of the design primitives.

* * * * *